United States Patent [19]

Beerwald et al.

[11] 4,349,582
[45] Sep. 14, 1982

[54] GAS-DISCHARGE METHOD FOR COATING THE INTERIOR OF ELECTRICALLY NON-CONDUCTIVE PIPES

[76] Inventors: Hans Beerwald, Kalkgasse 2, 5370 Kall-Sistig; Günter Böhm, Haarholzer Strasse 21; Günter Glomski, Scharnhorststrasse 2, both of 4630 Bochum, all of Fed. Rep. of Germany

[21] Appl. No.: 240,539

[22] Filed: Mar. 4, 1981

[30] Foreign Application Priority Data

Mar. 18, 1980 [DE] Fed. Rep. of Germany ....... 3010314

[51] Int. Cl.³ .................... B05D 3/02; B05D 3/06; B05D 7/22
[52] U.S. Cl. .......................... 427/38; 427/39; 427/45.1; 427/238; 427/239; 427/248.1
[58] Field of Search ............ 427/45.1, 238, 239, 427/248.1, 38, 39

[56] References Cited

U.S. PATENT DOCUMENTS 3,484,276 12/1969 Burggraaf et al. ............ 427/45.1 X
4,262,035 4/1981 Jaeger et al. .................. 427/45.1 X

FOREIGN PATENT DOCUMENTS 2416379 11/1975 Fed. Rep. of Germany ..... 427/45.1

*Primary Examiner*—Michael R. Lusignan
*Attorney, Agent, or Firm*—Allison C. Collard; Thomas M. Galgano

[57] ABSTRACT

A method for coating the interior of electrically non-conductive pipes by means of a reactive separation from a gas flowing through the pipe, whereby the gas is dissociated by an electrical gas discharge, and wherein the separation occurs simultaneously throughout the total pipe length. Pulse discharges are used having pulse lengths which are so adjusted to the transit time of the gas through the pipe that the time period between two successive pulses corresponds to the time which is required for filling the pipe with unused gas.

5 Claims, 1 Drawing Figure

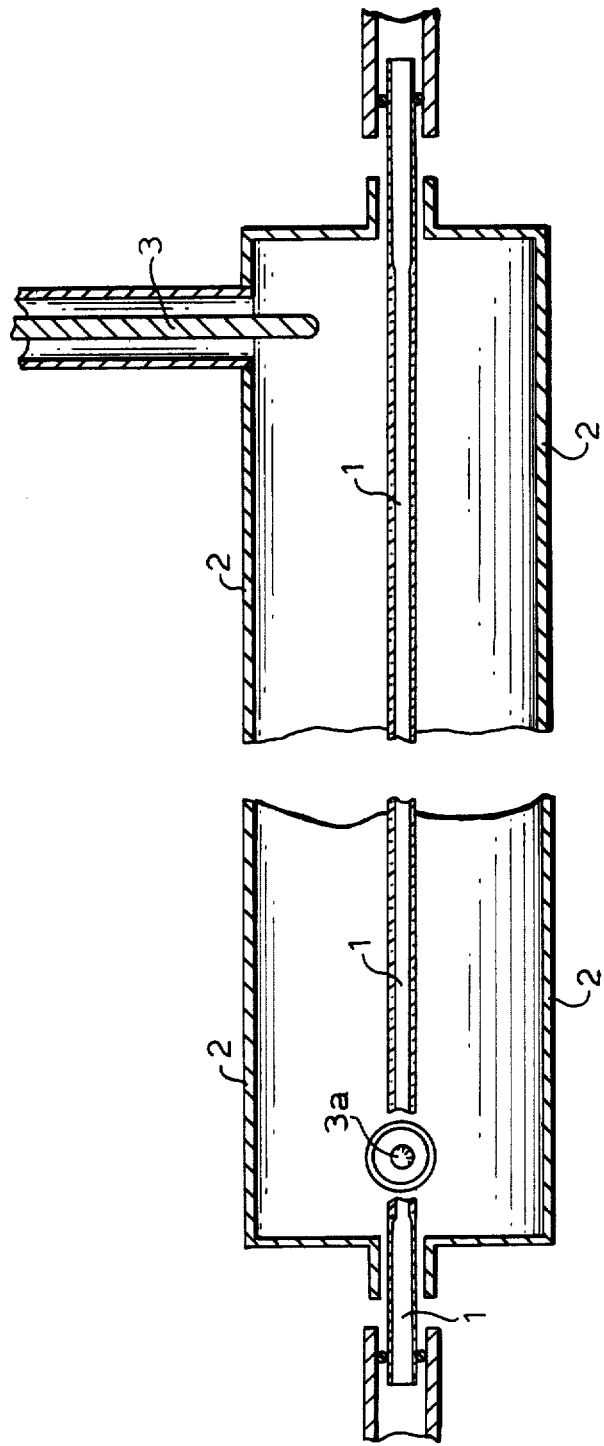

GAS-DISCHARGE METHOD FOR COATING THE INTERIOR OF ELECTRICALLY NON-CONDUCTIVE PIPES

The invention relates to a plasma coating method. More particularly, it relates to a method for coating the interior of glass or ceramic pipes by means of a reactive separation or deposition of a gas flowing through the pipe which is dissociated by an electrical gas discharge over the total pipe length to be coated.

In the plasma coating method, the flowing gas is ionized and its molecules are dissociated. Although the ionization degree is low, rarely exceeding 1%, the degree of dissociation may reach high values between 50% and 100%. The dissociated components form new molecules on the pipe wall which constitute the new coating material.

Plasma coating methods are known from the state of the art (see, e.g., German Offenlegungsschrift No. 23 28 930, German Patentschrift No. 24 44 100, German Offenlegungsschrift No. 26 42 949, German Offenlegungsschrift No. 27 12 993 and German Offenlegungsschrift No. 28 04 125). In these methods, the gas discharge plasma is generated in a short zone with respect to the total pipe length and this plasma zone is axially displaced, so as to obtain a uniform coating over a certain pipe length of about one meter. These known plasma coating methods all require a relative movement between the plasma exciting device and the pipe to be coated.

Moreover, the device for the mechanical relative movement is expensive and requires frequent maintenance.

It is therefore an object of the invention to provide a plasma coating method wherein the coating is carried out simultaneously over the total pipe length with a high reaction yield. The difficulty in such a method is that the introduced gas is already consumed at the beginning of the pipe in a burning discharge over the total pipe length.

One possibility for obtaining a uniform coating over the total pipe length would be to burn the gas discharge in such a weak manner that the degree of dissociation remains low, so that a sufficient amount of unconsumed gas remains for the other pipe end. This solution is disadvantageous in that the unconsumed gas is discharged, and that the reaction yield, as well as the coating speed, is low.

Tests with gas discharge pulses have shown that the degree of dissociation depends on the average electrical power input, and not on the pulsing ratio, if the only condition maintained is that the pulse length or duration is not longer than the time which the gas needs to pass through the plasma zone. The subject of the invention makes uses of this result and provides a gas discharge pulse with a small pulsing ratio of about 0.01 to 0.1, wherein the pulse length equals the transit time of the gas through the length of the pipe. By this measure, it is assured that unconsumed gas is available throughout the total discharge space for each individual discharge.

The generation of long plasma columns which extend over the total pipe length to be coated may be obtained with the assistance of microwave pulses or with electrical direct or alternating fields.

When microwaves are used, the coaxial system consisting of the plasma column, glass pipe and metal pipe is used as the wave conductor (i.e. guide system).

A longitudinal field may be applied by simple interiorly-disposed electrodes which are applied in the proximity of the pipe ends, or by exteriorly-disposed electrodes, if sufficiently high field frequencies are available.

The advantages of the inventive method are that simple discharge geometries may be used and that a displacement of the plasma exciting device is not required.

One embodiment of the invention, wherein a quartz glass pipe is coated with doped $SiO_2$ with an average microwave output of 500 W, in accordance with the invention, is described in conjunction with the appended drawing.

In the FIGURE, a cross-sectional view of the apparatus used in conjunction with the method embodying the invention is illustrated.

Referring now in detail to the FIGURE, a quartz pipe 1 (inside diameter 1 cm, length 1 m) is disposed coaxially within a heatable high-grade steel pipe 2, the diameter of which is 9 cm. The electrical energy for the plasma generation is supplied by two magnetrons (Type YJ1500, frequency 2450 MHz) which are operated with synchronous current pulses. The microwave energy is introduced via two pins 3 and 3a. In this manner, two $H_{11}$-waves are excited which are polarized perpendicularly with respect to each other, so that a mutual interference of the two magnetrons is prevented. The flow speed of the gases ($SiCl_4 + O_2 + GeCl_4$, total pressure 10 Torr) is 10 m/s. Consequently, the pulse length has a duration of 100 ms. The pulse power of each magnetron is 5 kW. At a pulse duration of 5 ms, the median total or mean power is 500 W.

Any inhomogeneity of the coating in the longitudinal direction which is caused by the axial pressure gradient in the flowing gas can be reduced by setting an uneven pulse power of the two magnetrons.

Thus, while only one embodiment of the present invention has been shown and described, it will be obvious that many changes and modifications may be made thereunto, without departing from the spirit and scope of the invention.

What is claimed is:

1. In a method for coating the interior of an electrically-nonconductive pipe by means of a reactive deposition of a gas flowing through the pipe, of the type wherein the gas is disassociated by an electric gas discharge and wherein the deposition occurs simultaneously throughout the total pipe length, the improvement comprising the steps of:
   (a) generating a flow of an ionizable gas through said pipe; and
   (b) generating gas discharge pulses in said pipe to effect a vapor deposition of said gas on the interior of said pipe, said pulses have a pulse duration and frequency adjusted to the transit time of the gas flowing through the pipe so that the time period between two successive pulses corresponds to the time which is required for filling the pipe with unused gas so that deposition occurs simultaneously over the total pipe length in a homogeneous manner.

2. The method according to claim 1, additionally including the step of coaxially mounting the pipe in a fixed manner and wherein said gas discharge is generated with microwaves produced by at least one magnetron mounted in a fixed position.

3. The method according to claim 1 or 2, additionally including the step of introducing the microwave power at various places along the pipe axis of the pipe to be coated.

4. The method according to claim 1, wherein said gas discharge is generated by an electrical longitudinal field which extends at least over the total pipe length to be coated.

5. The method according to claim 1, wherein said pulse duration equals the transmit time of the gas through the length of the pipe.

* * * * *